United States Patent
Terasawa et al.

(10) Patent No.: US 7,254,084 B2
(45) Date of Patent: Aug. 7, 2007

(54) DATA PROCESSING DEVICE

(75) Inventors: Masaaki Terasawa, Akishima (JP);
Yoshiki Kawajiri, Musashino (JP);
Takanori Yamazoe, Hadano (JP)

(73) Assignee: Renesas Technology Corp., Tokyo (JP)

( * ) Notice: Subject to any disclaimer, the term of this patent is extended or adjusted under 35 U.S.C. 154(b) by 54 days.

(21) Appl. No.: 11/138,344

(22) Filed: May 27, 2005

(65) Prior Publication Data
US 2006/0114737 A1    Jun. 1, 2006

(30) Foreign Application Priority Data
Nov. 30, 2004   (JP)   ............................. 2004-345688

(51) Int. Cl.
*G11C 5/14* (2006.01)
*G11C 16/04* (2006.01)
*G11C 16/06* (2006.01)

(52) U.S. Cl. ............ 365/229; 365/185.23; 365/185.27; 365/227

(58) Field of Classification Search ................ 365/229, 365/227, 226, 185.27, 185.18
See application file for complete search history.

(56) References Cited

U.S. PATENT DOCUMENTS 5,905,685 A * 5/1999 Nakamura et al. .......... 365/207
5,920,226 A * 7/1999 Mimura ........................ 327/537
2001/0013769 A1 * 8/2001 Saito ............................ 323/282

FOREIGN PATENT DOCUMENTS

JP          60-95794           5/1985
JP          09213913 A    *   8/1997

* cited by examiner

Primary Examiner—Amir Zarabian
Assistant Examiner—Ly Duy Pham
(74) Attorney, Agent, or Firm—Miles & Stockbridge P.C.

(57) ABSTRACT

A delay from the release of a low power consumption mode of nonvolatile memory to the restart of read operation is reduced. Nonvolatile memory which can electrically rewrite stored information has in well regions plural nonvolatile memory cell transistors having drain electrodes and source electrodes respectively coupled to bit lines and source lines and gate electrodes coupled to word lines and storing information based on a difference between threshold voltages to a word line select level in read operation, and the nonvolatile memory has a low power consumption mode. In the low power consumption mode, a second voltage lower than a circuit ground voltage and higher than a first negative voltage necessary for read operation is supplied to the well regions and word lines. When boost forming a rewriting negative voltage therein, a circuit node at a negative voltage is not the circuit ground voltage in the low power consumption mode.

4 Claims, 18 Drawing Sheets

FIG. 5

| PROGRAMMING DATA | APPLIED VOLTAGES | | |
|---|---|---|---|
| "0" PROGRAM | PRE-WRITE VOLTAGE | ERASE VOLTAGE | WRITE VOLTAGE |
| "1" PROGRAM | PRE-WRITE VOLTAGE | ERASE VOLTAGE | WRITE-INHIBIT VOLTAGE |

DATA PROCESSING DEVICE

CROSS-REFERENCE TO RELATED APPLICATION

The present application claims priority from Japanese patent application No. 2004-345688 filed on Nov. 30, 2004, the content of which is hereby incorporated by reference into this application.

BACKGROUND OF THE INVENTION

The present invention relates to a data processing device having nonvolatile memory which can electrically rewrite stored information. For instance, the present invention relates to a technique effective to be applied to EEPROM (electrically erasable and programmable read only memory) employing an on-chip MONOS (metal oxide nitride oxide semiconductor) type memory cell of 1 transistor/1 bit of a microcomputer for an IC card.

A nonvolatile memory transistor which can electrically rewrite stored information has a channel forming region between a source electrode and a drain electrode and a charge storage region (trap region) storing electric charges such as electrons or holes via a gate oxide film over the channel forming region so as to form a memory gate electrode thereover via an insulator film. It is possible to reversibly employ an enhancement state holding electrons in the charge storage region to increase the threshold voltage (for example, a write state or a hold state of data "0") and a depression state moving electrons from the charge storage region in the discharge direction to decrease the threshold voltage (for example, an erase state or a hold state of data "1"). In read operation, a negative voltage larger in an absolute value than the threshold voltage in the erase state is applied to the memory gate electrode. No read current can be flowed to an unselected memory cell at read. A voltage between the threshold voltage in the erase state and the threshold voltage in the write state may be applied to the memory gate electrode of a selected memory cell at read. It is unnecessary for a memory cell to employ the structure of 2 transistors/1 bit in which a select transistor for distinguishing select from unselect is connected to a memory transistor in series. Such nonvolatile memory is described in Patent document 1. [Patent document 1] Japanese Unexamined Patent Publication No. Sho 60 (1985)-095794

SUMMARY OF THE INVENTION

The present inventors have studied rewritable nonvolatile memory of 1 transistor/1 bit. First, when boost forming a rewriting negative voltage therein, the present inventors have studied the stop of the booster in a low power consumption mode from the viewpoint of low power consumption. When stopping the booster, a circuit node at a negative voltage becomes a circuit ground voltage. When releasing the low power consumption mode, boosting operation is restarted from the beginning. The present inventors have proved that the start of the later read operation is delayed. Second, in driving an unselected word line to a negative voltage such as −2V and a selected word line to a voltage such as 0V by a word driver in read operation, when inverting a word line voltage by the word driver, the inverting speed depends on the charging ability and the discharging ability of the word driver. When they are not balanced, the access time of read operation is matched with the operation of the slower one. The present inventors have revealed that when there is an unignorable significant difference between Vgs (gate-source voltage) when an n-channel MOS transistor of a CMOS inverter is turned on and Vgs when a p-channel MOS transistor of the CMOS inverter is turned on, the employment of an output circuit like the CMOS inverter for the output stage of the word driver is not enough. Third, the present inventors have made it apparent that when the operating speed switching application of a high voltage or a source voltage is too high in write operation and erase operation, a relatively large electric current is abruptly flowed to cause power source noise. Such power source noise can cause malfunction of nonvolatile memory and a data processing device over which the same is mounted. Fourth, when applying a high voltage to bit lines at write and erase, the bit lines need be selectively isolated from a read system connected to a sense amplifier. A high voltage MOS transistor having a thick gate oxide film is employed for such an isolating circuit. The present inventors have found that an undesired resistance component in a read path is increased in read operation to lower the read speed of stored information.

A representative object of the present invention is to reduce a delay from the release of a low power consumption mode of nonvolatile memory to the restart of read operation.

Another representative object of the present invention is to make the inverting operation of a word line voltage of a word driver in nonvolatile memory fast.

A further representative object of the present invention is to prevent relatively large power source noise with the operation switching application of a high voltage or a source voltage in write operation and erase operation in nonvolatile memory from being caused.

A still another representative object of the present invention is to eliminate the lowering of read speed due to on-state resistance of a high voltage transistor selectively isolating from a read system bit lines to which a high voltage is applied at write and erase in nonvolatile memory.

The above and other objects and novel features of the present invention will be apparent from the description of this specification and the accompanying drawings.

The representative inventions disclosed in this application will be described briefly as follows.

[1] A data processing device has nonvolatile memory which can electrically rewrite stored information, wherein the nonvolatile memory has in well regions plural nonvolatile memory cell transistors having drain electrodes and source electrodes respectively coupled to bit lines and source lines and gate electrodes coupled to word lines and storing information based on a difference between threshold voltages to a word line select level in read operation, wherein the nonvolatile memory has a low power consumption mode. In the low power consumption mode, a second voltage lower than a circuit ground voltage and higher than a first negative voltage necessary for read operation is supplied to the well regions and word lines.

As described above, when boost forming a rewriting negative voltage therein, a circuit node at a negative voltage does not have the circuit ground voltage in the low power consumption mode and boosting operation time necessary from the release of the low power consumption mode of the nonvolatile memory to the restart of read operation can be shortened to reduce a delay for restarting the read operation.

As a specific form of the present invention, an equal third voltage is supplied to the word lines and the source lines of the nonvolatile memory cell transistors in the low power consumption mode. When the second voltage is equal to the third voltage, no useless electric field can act on the nonvolatile memory cell transistors. A booster held by the data processing device may form the first voltage and the second voltage for the low power consumption mode.

[2] A data processing device has nonvolatile memory which can electrically rewrite stored information, wherein the nonvolatile memory has plural nonvolatile memory cell transistors formed in well regions having drain electrodes and source electrodes respectively coupled to bit lines and source lines and gate electrodes coupled to word lines and storing information based on a difference between threshold voltages to a word line select level in read operation, and a word driver selectively driving the word lines to a circuit ground voltage, a positive voltage or a negative voltage thereto in accordance with an operating mode, wherein the word driver has in an output stage a CMOS inverter arranged between a first terminal to which the circuit ground voltage or the positive voltage is supplied and a second terminal to which the negative voltage is supplied, and an n-channel MOS transistor connected in parallel with a p-channel MOS transistor of the CMOS inverter and switch controlled in phase. In the word driver, in a read operation mode, when charging the read-unselected word line to be read-selected from the negative voltage to the ground voltage, the voltage of the first terminal is increased to the positive voltage while the word line at the negative voltage has the ground voltage.

As described above, when Vgs when the p-channel MOS transistor of the CMOS inverter is turned on is smaller than Vgs when the n-channel MOS transistor of the CMOS inverter is turned on, the n-channel MOS transistor connected in parallel with the p-channel MOS transistor of the CMOS inverter and switch controlled in phase is added. When inversion driving an unselected word line at a negative voltage such as −2V to the select level such as 0V by the word driver, the n-channel MOS transistor can complement the driving ability of the p-channel MOS transistor of the CMOS inverter. During the driving period, the drain voltage of the n-channel MOS transistor is increased from the circuit ground voltage to the positive voltage. The word line charging ability of the n-channel MOS transistor can be increased. The positive voltage is desirably a voltage above the threshold voltage of the channel MOS transistor.

As a specific form of the present invention, in the nonvolatile memory cell in read operation, the read-unselected word line and the well region have a first negative voltage, the read-selected word line has a circuit ground voltage, and the bit line and the source line have the same voltage, in the nonvolatile memory cell in a first operation increasing the threshold voltage, the unselected word line, the source line, the bit line, and the well region in the first operation have a second negative voltage, and the selected word line in the first operation has a third positive voltage, in the nonvolatile memory cell in a second operation decreasing the threshold voltage, the unselected word line, the source line, the bit line, and the well region in the second operation have a fourth positive voltage, and the selected word line in the second operation has a fifth negative voltage. The third voltage is equal to the fourth voltage.

[3] A data processing device has nonvolatile memory which can electrically rewrite stored information, wherein the nonvolatile memory has plural nonvolatile memory cell transistors storing information based on a difference between threshold voltages, and a power source circuit generating an operating power source necessary for each of an operation changing the threshold voltage of the nonvolatile memory cell transistor and an operation reading stored information in accordance with an operating mode. The power source circuit has a speed control circuit controlling the rising and falling speeds of the operating power source necessary for the operating mode.

The speed control circuit can prevent the operating speed switching application of a high voltage or a source voltage in write operation and erase operation from being too high. It is possible to prevent abrupt flowing of a relatively large electric current and causing power source noise.

As a specific form of the present invention, the nonvolatile memory cell transistors formed in well regions have drain electrodes and source electrodes respectively coupled to bit lines and source lines and gate electrodes coupled to word lines and store information based on a difference between threshold voltages to a word line select level in read operation, wherein in the nonvolatile memory cell in read operation, the read-unselected word line and the well region have a first negative voltage, the read-selected word line has a circuit ground voltage, and the bit line and the source line have the same voltage, wherein in the nonvolatile memory cell in a first operation increasing the threshold voltage, the unselected word line, the source line, the bit line, and the well region in the first operation have a second negative voltage, and the selected word line in the first operation has a third positive voltage, wherein in the nonvolatile memory cell in a second operation decreasing the threshold voltage, the unselected word line, the source line, the bit line, and the well region in the second operation have a fourth positive voltage, and the selected word line in the second operation has a fifth negative voltage.

As a further specific form of the present invention, the speed control circuit has a first control circuit controlling rising and falling of the third voltage and fourth voltage using a time constant device, and a second control circuit controlling rising and falling of the second voltage and fifth voltage using a time constant device.

[4] A data processing device has nonvolatile memory which can electrically rewrite stored information, wherein the nonvolatile memory has a memory array having plural nonvolatile memory cell transistors having drain electrodes and source electrodes respectively coupled to bit lines and source lines and gate electrodes coupled to word lines, wherein a high voltage is selectively applied to the bit lines when changing the threshold voltage of the nonvolatile memory cell transistor to rewrite stored information, wherein the bit lines are connected to a column switch circuit, wherein the nonvolatile memory has an isolating circuit which can selectively isolate the column switch circuit from the memory array via a switch transistor, wherein the switch transistor has a gate breakdown voltage to the high voltage, wherein the nonvolatile memory has a booster generating a switch control voltage on-operating the switch transistor by positive boosting operation at an external source voltage.

A high voltage is applied to bit lines at write and erase. The bit lines can be selectively isolated from a read system such as a sense amplifier via the isolating circuit. High voltage switch MOS transistors having a thick gate oxide film are employed for such isolating circuit. In read operation, a control voltage on-operating the high voltage switch MOS transistor is formed by boosting operation of the external source voltage. The on-state resistance is relatively small. It is possible to prevent increase of an undesired resistance component in a read path and lowering of the read speed of stored information.

The effects obtained by the representative inventions disclosed in this application will be described briefly as follows.

According to a representative invention, it is possible to reduce a delay from the release of a low power consumption mode of nonvolatile memory to the restart of read operation.

According to another representative invention, it is possible to make the inverting operation of a word line voltage of a word driver in nonvolatile memory fast.

According to a further representative invention, it is possible to prevent relatively large power source noise with the operation switching application of a high voltage or a source voltage in write operation and erase operation in nonvolatile memory from being caused.

According to a still another representative invention, it is possible to eliminate the lowering of read speed due to on-state resistance of a high voltage transistor selectively isolating from a read system bit lines to which a high voltage is applied at write and erase in nonvolatile memory.

BRIEF DESCRIPTION OF THE DRAWINGS

FIG. 5 is an explanatory view showing voltage application forms when storing information in a nonvolatile memory cell;

DETAILED DESCRIPTION OF THE INVENTION

<<Microcomputer>>

Figure 1:
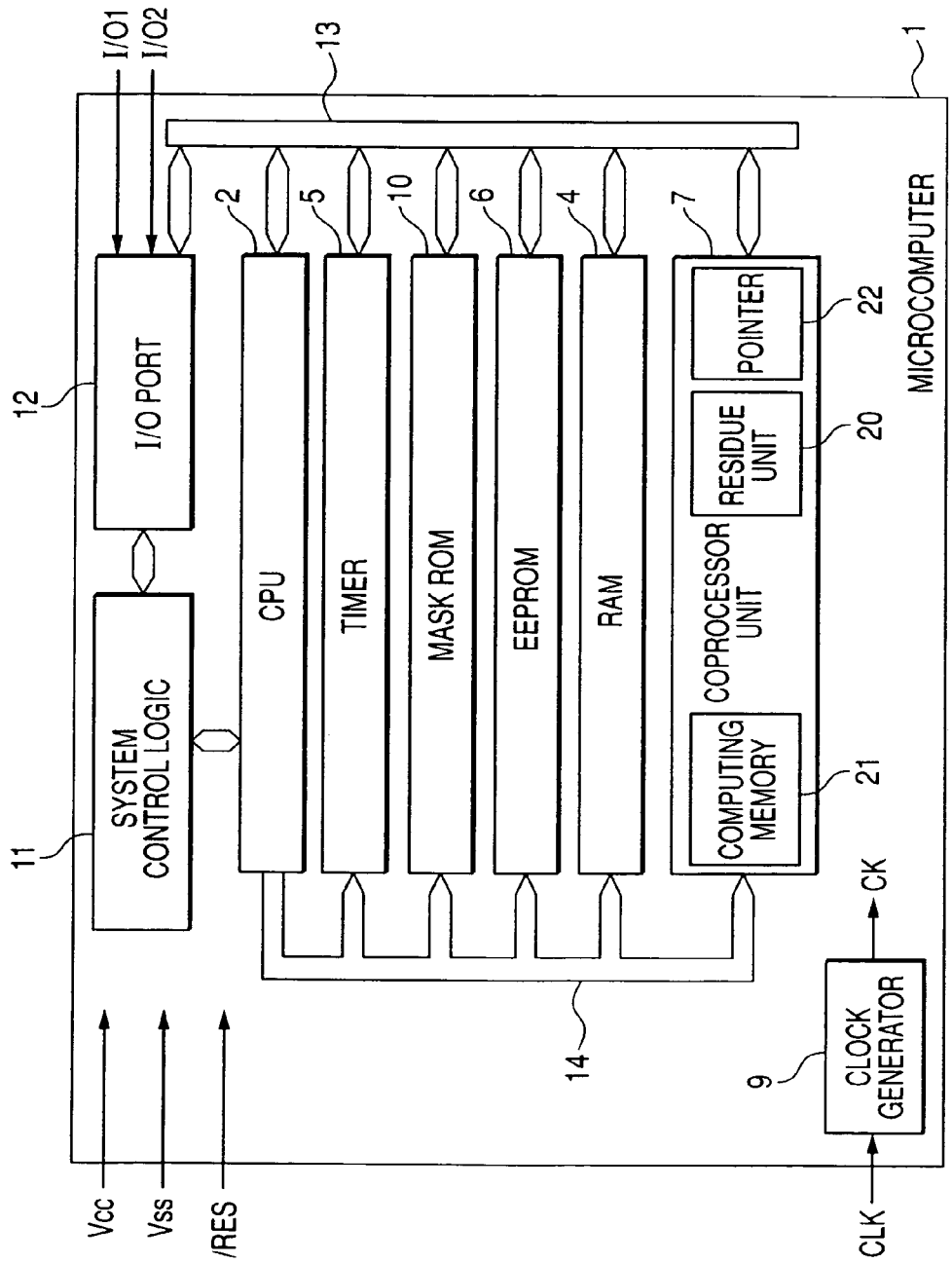
FIG. 1 is a block diagram showing a microcomputer.

FIG. 1 shows a microcomputer as an example of a data processor. A microcomputer 1 shown in the drawing, not being particularly limited, is a microcomputer for an IC card called an IC card microcomputer. The microcomputer 1 shown in the drawing is formed over one semiconductor substrate or semiconductor chip such as single crystal silicon by the data processing device manufacturing technique such as CMOS.

The microcomputer 1 has a central processing unit (CPU) 2, random access memory (RAM) 4, a timer 5, EEPROM (electrically erasable and programmable read only memory) 6, a coprocessor 7, a clock generator 9, mask ROM 10, a system control logic 11, an input/output port (I/O port) 12, a data bus 13, and an address bus 14.

The EEPROM 6 is used for storing data employed in computing processing of the CPU 2. The mask ROM is used for storing a program (operating program) executed by the CPU 2. The RAM 4 is a work area of the CPU 2 or a temporary storage area of data and is constituted of SRAM (static random access memory) or DRAM (dynamic random access memory). The CPU 2 fetches an instruction from the mask ROM 10, decodes the fetched instruction, and performs operand fetch and data computation based on the decoded result. The coprocessor 7 is a processor unit performing in place of the CPU 2 remainder multiplication processing in RSA and elliptic curve cryptography computation. The I/O port 12 has 2-bit input/output terminals I/O1 and I/O2 and serves as input and output of data and input of an external interrupt signal. The I/O port 12 is coupled to the data bus 13. The data bus 13 is connected to the CPU 2, RAM 4, timer 5, EEPROM 6, mask ROM 10, and coprocessor 7. In the microcomputer 1, the CPU 2 is a bus master module and can output an address signal to the address bus 14 connected to the RAM 4, timer 5, EEPROM 6, mask ROM 10, and coprocessor 7. The system control logic 11 performs control of an operating mode and interrupt control of the microcomputer 1 and has a random number generation logic used for generating an encryption key. RES/ is a reset signal to the microcomputer 1. The inside of the microcomputer 1 is initialized when instructing reset operation by the reset signal RES/. The CPU 2 starts instruction execution from the head address of a program held by the mask ROM 10. The clock generator 9 receives external clock signal CLK to generate internal clock signal CK. The microcomputer 1 is operated in synchronization with the internal clock signal CK.

Not being particularly limited, the CPU 2 is a 32-bit CPU, enables computing processing by 32 bits, and has a 32-bit general register and a 32-bit arithmetic logic unit, not shown. The data bus 13 has 32 bits. Most of data transfer instructions and computing instructions included in the instruction set of the CPU 2 can process data by 32 bits. The data access unit of the CPU 2 is 8 bits. Here, the data access unit means the number of bits of a data area constituting the smallest unit of an address in the address space managed by the CPU 2. The data access unit is 8 bits.

The EEPROM 6 is nonvolatile memory which electrically enables erase operation and write operation. Here, the erase operation is a method for erasing stored information held by a nonvolatile memory cell and means processing of the lowering the threshold voltage of a nonvolatile memory cell. The state that the threshold voltage of a memory cell realized by this operation is low is called an erase state. The write operation is a method for holding information held in a nonvolatile memory cell and means an operation increasing the threshold voltage of a nonvolatile memory cell. The state that the threshold voltage of a memory cell realized by this operation is high is called a write state. Depending on whether the nonvolatile memory cell is in the erase state or the write state, '1' or '0' of the value of 1 bit can be stored in the memory cell. The EEPROM 6 enables erase processing by 8 bits and write processing and read by 32 bits. The EEPROM 6 is used as an area storing data by a predetermined computing processing unit such as an encryption key used for encrypting input/output data and ID information used for specifying an individual. In the write processing of an encryption key used in the computing processing of the CPU 2, stored information can be erased in accordance with the data length (e.g., 8 bits) of a necessary computing processing unit. The mask ROM 10 holds a program processed by the CPU 2. It holds a virtual machine language program, an encrypting program, and a decoding program.

Figure 2:
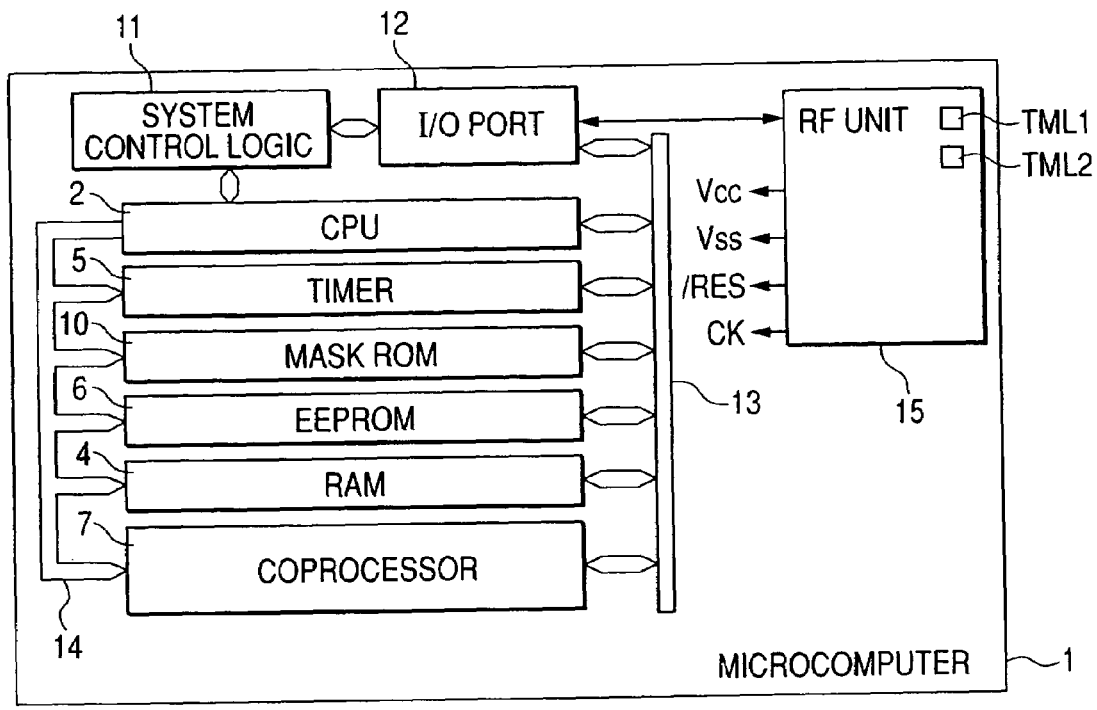
FIG. 2 is a block diagram showing another example of the microcomputer.

FIG. 2 shows another example of the microcomputer 1. The external interface means of the microcomputer 1 shown in the drawing is different from the microcomputer 1 of FIG. 1. The microcomputer of FIG. 2 has a radio frequency part 15 having antenna terminals TML1 and TML2 connectable to an antenna, not shown. The radio frequency part 15 outputs source voltage Vcc using as an operating power source an induced current produced in such a manner that the antenna crosses a predetermined electric wave (e.g., a microwave), generates the reset signal RES and the clock signal CK, and inputs and outputs information from the antenna in a noncontact manner. The I/O port 12 transmits and receives information to be inputted and outputted to/from the outside to/from the RF unit 15.

<<Nonvolatile Memory>>

Figure 3:
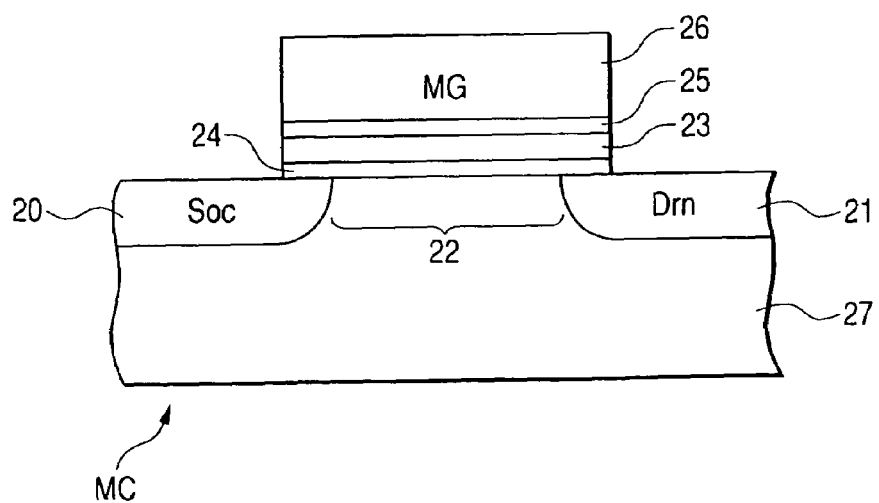
FIG. 3 is a longitudinal cross-sectional view showing the structure of a nonvolatile memory cell transistor employed for EEPROM.

FIG. 3 shows a longitudinal cross-sectional view of the structure of a nonvolatile memory cell transistor employed in the EEPROM 6. Nonvolatile memory cell transistor (simply called a memory cell) MC shown in FIG. 3 has a MONOS structure formed in a p type well region 27 provided over a silicon substrate. It has an n type diffusion layer (n type impurity region) 20 as a source line connection electrode (source electrode Soc) connected to a source line, an n type diffusion layer (n type impurity region) 21 as a bit line connection electrode (drain electrode Drn) connected to a bit line, a channel forming region 22 between a source electrode and a drain electrode, a charge storage insulator film (silicon nitride film) 23, insulator films 24 and 25 arranged at the upper and lower sides of the charge storage insulator film 23 and formed of a silicon oxide film, and a memory gate electrode (MG) 26 formed of an n type polysilicon layer and used for applying a high voltage in write operation or erase operation. The insulator film 24 has a film thickness of 1.5 nm, the charge storage insulator film 23 has a film thickness of 10 nm (converted into a silicon oxide film), and the insulator film 25 has a film thickness of 3 nm. The charge storage insulator film 23 and the insulator films 24 and 25 arranged at the face and back sides thereof are memory gate insulator films of an ONO (oxide film-nitride film-oxide film) structure.

Figure 4:
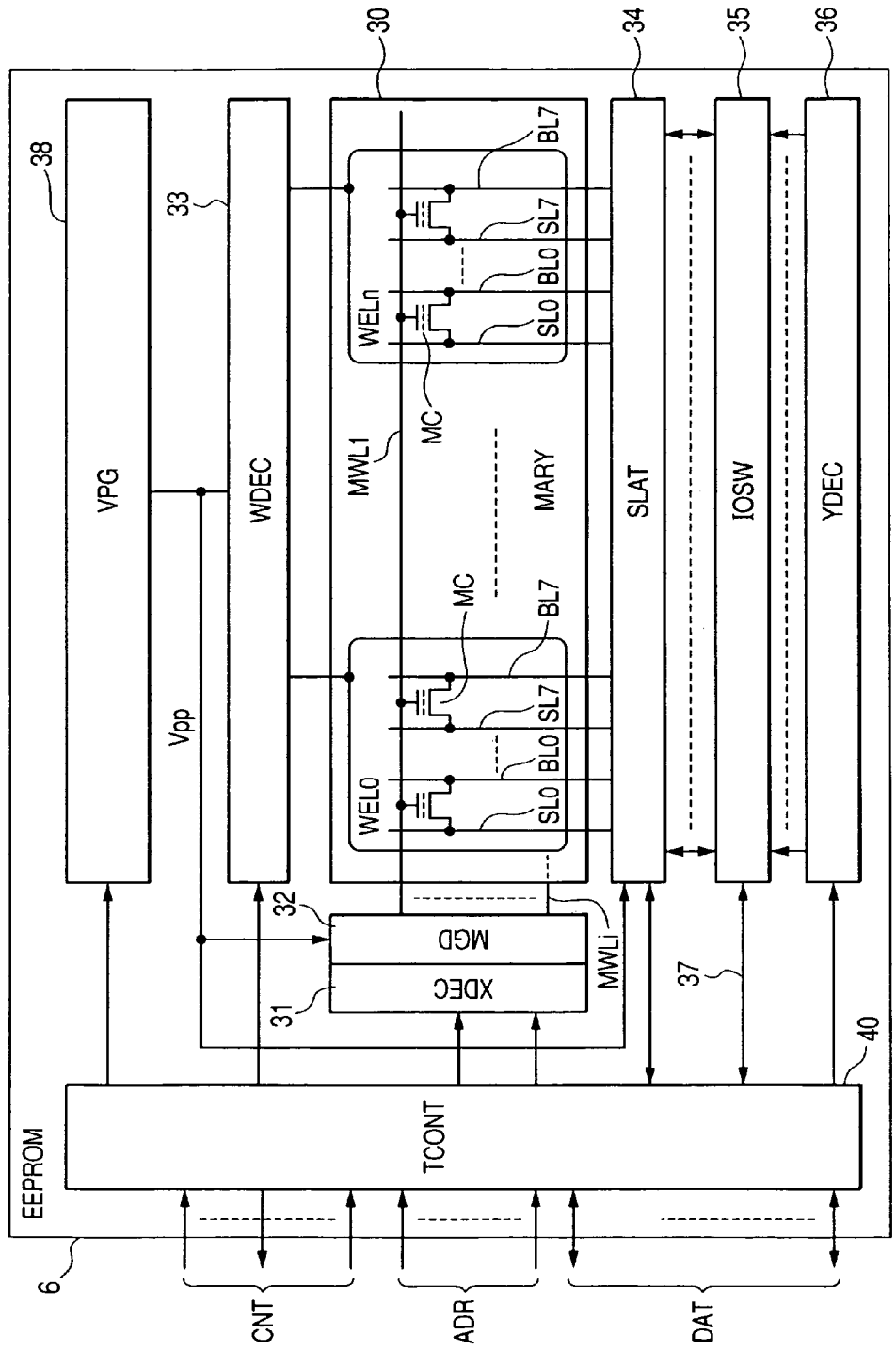
FIG. 4 is a block diagram of the EEPROM.

FIG. 4 shows a block diagram of the EEPROM 6. A memory array (MARY) 30 is divided into eight well regions WEL0 to WELn in the row direction and has plural nonvolatile memory cells MC arranged in a matrix. FIG. 4 representatively shows nonvolatile memory cells for one row. Actually, nonvolatile memory cells are arranged for plural rows. Eight nonvolatile memory cells MC are arranged in each of the well regions WEL0 to WELn to one shared word line. The drain electrodes 21 of the nonvolatile memory cells MC arranged in the same column are connected to corresponding bit lines BL0 to BL7. The source electrodes 20 of the nonvolatile memory cells MC arranged in the same column are connected to corresponding source lines SL0 to SL7.

Word lines MWL1 to MWLi (representatively called word line MWL) are driven by a word driver circuit (MGD) 32 in accordance with the decode output of an X address decoder (XDEC) 31. The voltages of the well regions WEL0 to WELn are controlled by a well decoder (WDEC) 33. The voltages of the bit lines BL0 to BL7 and the source lines SL0 to SL7 are controlled by latch data of a latch circuit (SLAT) 34. The latch circuit 34 is connected to a column switch circuit (IOSW) 35. The column switch circuit 35 can input and output write data or read data between a 32-bit shared data line 37 and the latch circuit 34 by 32 bits in accordance with the decode output of a Y address decoder (YDEC) 36. Not being particularly shown, a sense amplifier is arranged at the shared data line 37 side of the column switch circuit 35. A booster (VPG) 38 generates a high voltage for write operation and erase operation to supply it to the well decoder 33, the memory gate driver 32, and the sense latch circuit 34.

A control circuit (TCONT) 40 is connected to plural address input terminals ADR, access control terminals CNT, and data input/output terminals DAT, as external terminals. Of address signals inputted from the address input terminals ADR, an X address signal used for selecting the word line MWL is provided to the X address decoder 31 and a Y address signal used for selecting the bit lines BL0 to BL7 and the source lines SL0 to SL7 is provided to the well decoder 33 and the Y address decoder 36. Write data inputted from the data input/output terminals DAT is given to the shared data line 37. Read data from a memory cell is outputted from the data input/output terminals DAT via the shared data line 37. Erase operation, write operation, and read operation of the EEPROM 6 are instructed by an access control signal provided to the access control terminal CNT. Vdd is a source voltage supplied from the outside. Vss is a circuit ground voltage.

The control form of memory operation of the control circuit 40 is broadly divided into erase operation, write operation, and read operation. The erase operation is performed by applying a pre-write voltage, an erase voltage, and an erase-inhibit voltage. The write operation is performed by applying a write voltage and a write-inhibit voltage. The read operation is performed by applying a read voltage and a read-unselected voltage.

FIG. 5 shows voltage application forms when storing information in a nonvolatile memory cell. "0" program means increasing the threshold voltage of a memory cell to hold logic value "0" information ("0" information hold) "1" program means decreasing the threshold voltage of a memory cell to hold logic value "1" information ("1" information hold). The logic value "0" information in the nonvolatile memory cell is stored by applying a pre-write voltage, an erase voltage, and a write voltage. The logic value "1" information in the nonvolatile memory cell is stored by applying a pre-write voltage, an erase voltage, and a write-inhibit voltage.

Figure 6:
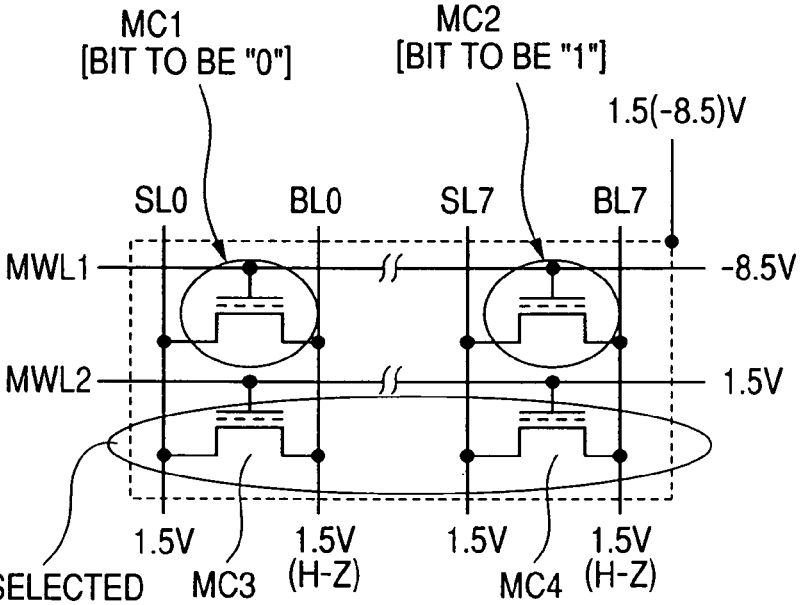
FIG. 6 is an explanatory view showing erase voltages and erase-inhibit voltages applied in erase operation.

FIG. 6 shows erase voltages and erase-inhibit voltages applied in erase operation. A well voltage of 1.5V is supplied as the erase voltage to an erased well region. A well voltage of −8.5V is supplied as the erase-inhibit voltage to an unerased well region. A memory gate voltage of −8.5V is supplied as the erase voltage to an erased word line. A memory gate voltage of 1.5V is supplied as the erase-inhibit voltage to an unerased word line. All the bit lines and the source lines are at 1.5V. The representatively shown memory cells MC1 and MC2 are erased. An electric field from the well region toward the memory gate electrode is formed. Electrons trapped in the charge storage insulator film 23 of the memory cells MC1 and MC2 are discharged via the oxide film to the well region by an FN tunnel. The threshold voltages of the memory cells MC1 and MC2 are negative voltages. The memory cells MC1 and MC2 are of the depression type. The representatively shown memory cells MC3 and MC4 are unerased to prevent an electric field necessary for discharging electrons from being formed. As is apparent from the drawing, erase is performed using 8 bits of a well unit as the smallest unit. In the example of FIG. 6, the memory cell MC1 is a memory cell to hold "0" information (a bit to be "0") and the memory cell MC2 is a memory cell to hold "1" information (a bit to be "1").

Figure 7:
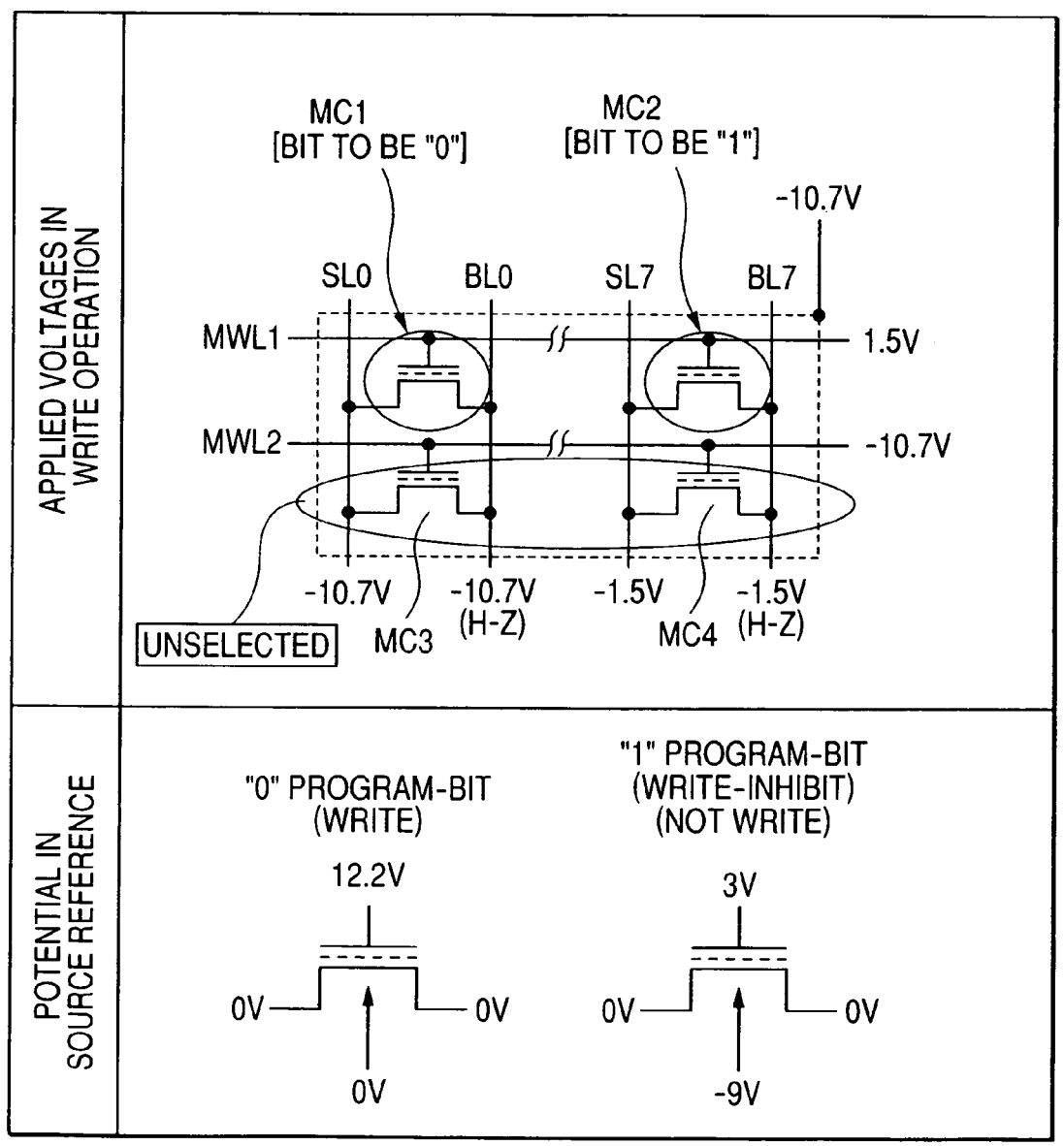
FIG. 7 is an explanatory view showing write voltages and write-inhibit voltages applied in write operation.

FIG. 7 shows write voltages and write-inhibit voltages applied in write operation. A well voltage of −10.7V is supplied as the write voltage to all well regions. A memory gate voltage of 1.5V is supplied as the write voltage to a written word line. The memory gate voltage of −10.7V is supplied as the write-inhibit voltage to an unwritten word line. The write voltage of −10.7V is applied to a source line and a bit line connected to a memory cell to hold "0" information. The write-inhibit voltage of 1.5V is applied to a source line and a bit line connected to a memory cell to hold "1" information. In the drawing, the memory cell M1 is write-selected and the memory cells M2 to M4 are write-unselected. An electric field from the memory gate electrode toward the well region is formed in the write-selected memory cell M1. Electrons are trapped from the well region of the memory cell MC1 in the charge storage insulator film 23 by the FN tunnel. The threshold voltage is a positive voltage. Such electric field is not formed in the representatively shown memory cells MC3 and MC4 and no electrons are trapped. The electric field is formed in the representatively shown memory cell MC2. Its channel region is inverted so that no electrons are trapped from the well region in the charge storage insulator film 23. The threshold voltage of the memory cell to hold "0" information (a bit to be "0") MC1 is increased. The threshold voltage of the memory cell to hold "1" information (a bit to be "1") MC2 remains at a negative voltage.

Here, the memory cell MC2 of FIGS. 6 and 7 is noted. The memory cell MC2 is a memory cell to hold "1" information (a bit to be "1") and is a memory cell in which application of the write voltage is inhibited in 8 bits as the smallest write unit. As shown in FIG. 6, the erase voltage is applied to the memory cell MC2 in erase operation. When a specified memory cell included in 8 bits as the smallest write unit is repeatedly a target to which the write voltage is not applied, it is considered that the erase voltage is continuously applied to the memory cell so that the threshold voltage is excessively lowered. Verify is not performed in write operation and erase operation. When the threshold voltage is excessively low, it cannot be directly detected. To prevent the threshold voltage in the erase state from being excessively low, the pre-write voltage is applied prior to application of the erase voltage in erase operation in the EEPROM 6.

The pre-write voltage is at the same level as that of the write voltages applied to memory cells to increase the threshold voltage like the memory cell MC1 of FIG. 7 which are the well region applied voltage (−10.7V), the memory gate voltage (1.5V), and the bit line and source line voltage (−10.7V) applied to the memory cells MC1 and MC2 of FIG. 7. The applying time of the pre-write voltage is shorter than the applying time of the write voltage. The pre-write voltage application operation is positioned as light write operation. When performing the light write, the threshold voltage of the nonvolatile memory cell in the erase state is relatively high. The threshold voltage of the nonvolatile memory cell in the write state is hardly changed. After applying the pre-write voltage, the threshold voltages of the memory cells are slightly varied to be positive threshold voltages. After that, the erase voltage is applied so that the threshold voltage of the memory cell in the erase state is lowered to the negative side by almost the same level as the memory cell in the write state. The threshold voltage of the nonvolatile memory cell in the erase state can be prevented from being cumulatively lowered.

Figure 8:
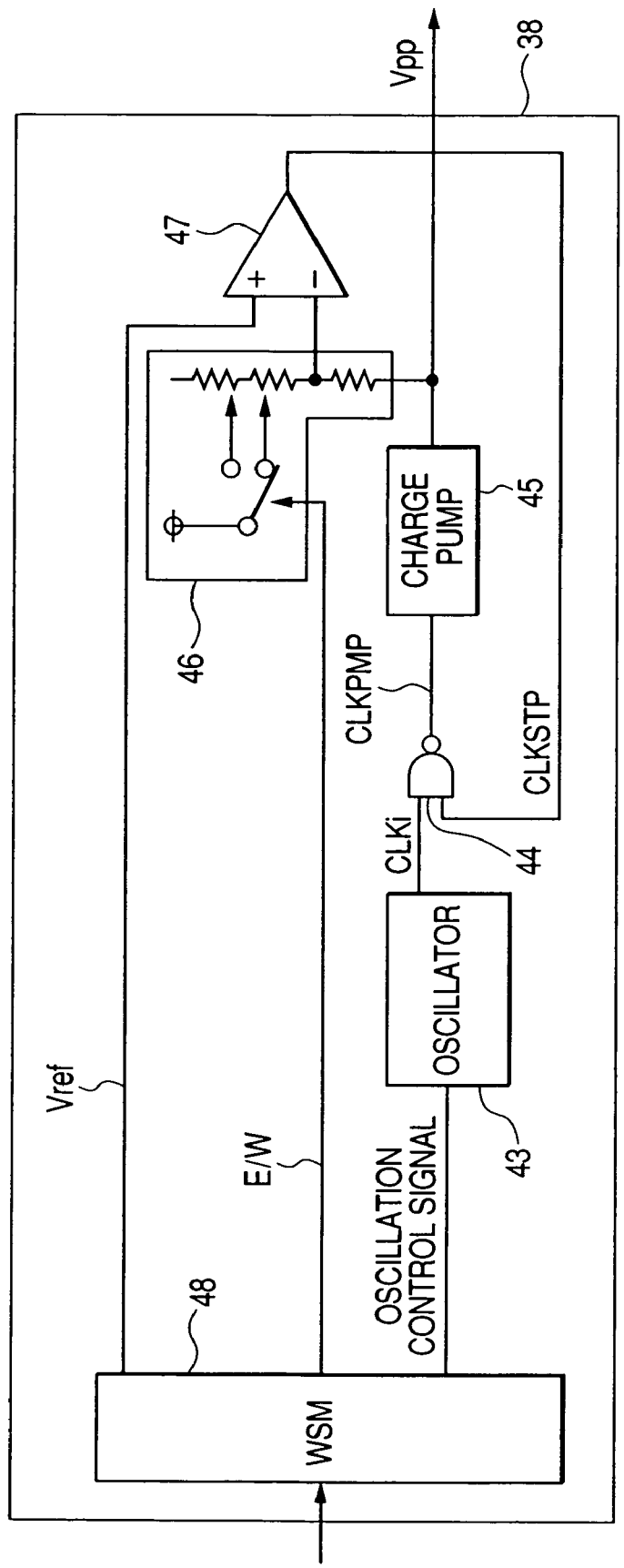
FIG. 8 is a block diagram showing a booster.

FIG. 8 shows an example of the booster 38. The clock signal CLKi outputted from an oscillator 43 is supplied via a NAND gate 44 to a charge pump circuit 45. The charge pump circuit 45 performs boosting operation in synchronization with the clock signal CLKi in the high level period of signal CLKSTP and stops the boosting operation in the low level period of the signal CLKSTP. Boosting voltage Vpp outputted from the charge pump circuit 45 is divided by a resistance type potential divider 46 and is compared with reference voltage Vref by a comparator 47. The compared result is fed back as the signal CLKSTP to the NAND gate 44. When the boosting voltage Vpp is lower than the specified voltage, the signal CLKSTP is at high level. When the boosting voltage Vpp is higher than the specified voltage, the signal CLKSTP is at low level. A predetermined boosting voltage is formed by negative feedback control. The level of the boosting voltage Vpp is different in write and erase. The level is instructed to the resistance type potential divider 46 by control signal E/W. A boosting control circuit (WSM) 48 generates the reference voltage Vref, the oscillation control signal, and the control signal E/W in accordance with the instruction from the control circuit 40. Not being particularly shown, the booster 38 can generate plural kinds of boosting voltages at the same time and has some circuit constructions of FIG. 8.

Verify is not performed in write and erase operations by the EEPROM 6. Verify is performed while applying a high voltage. The threshold voltage can be distributed in a predetermined area. Over-erase state due to cumulative erase voltage application can be prevented. The employment of verify delays erase and write operations. In the application in which data is rewritten by random access of the CPU 2, unlike the storage application such as a memory card, the speed of the random access is required to be increased. The on-chip EEPROM 6 of the microcomputer 1 for an IC card is excellent in satisfying the request to complete data rewrite requiring security immediately or in the shortest time.

Figure 9:
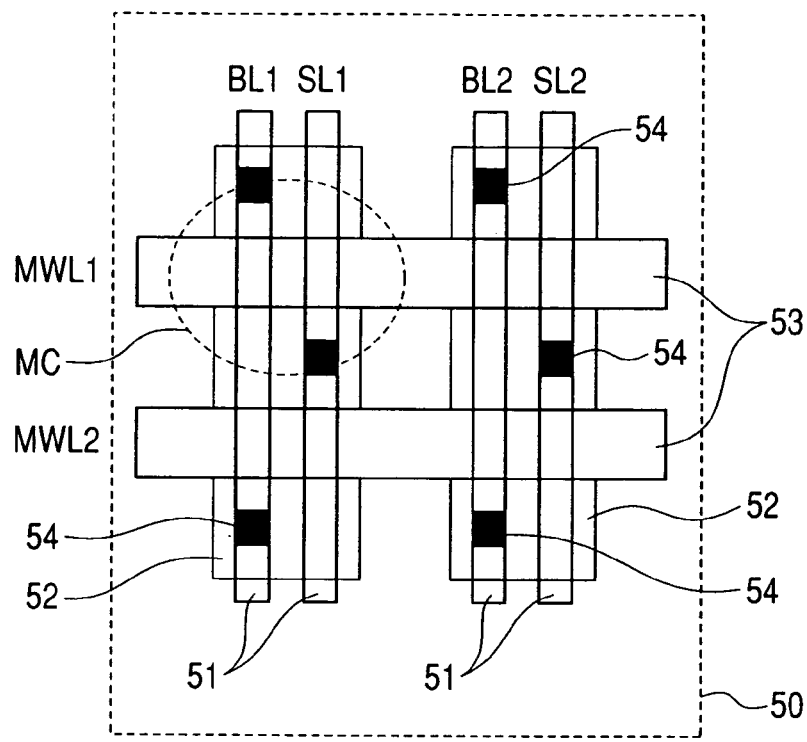
FIG. 9 is a plan view showing a layout structure of memory cells.

FIG. 9 shows the layout of the memory cells MC. The numeral 50 denotes a p type well region. The numeral 51 denotes metal wiring forming the bit lines BL1 and BL2 and the source lines SL1 and SL2. The numeral 52 denotes an active region formed in an N+ semiconductor region. The numeral 53 denotes polysilicon wiring constituting the word lines MWL1 and MWL2. The numeral 54 denotes a through hole for connecting the bit lines (BL1 and BL2) and the source lines (SL1 and SL2) to the drain regions and the source regions of the memory cells MC.

<<Operating Power Source at Standby>>

Figure 10:
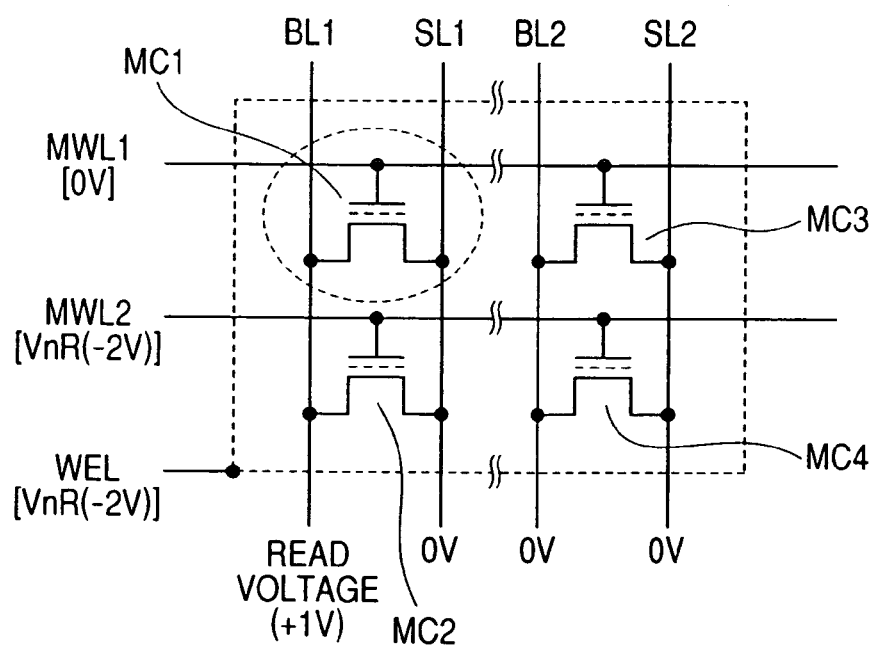
FIG. 10 is an explanatory view showing a voltage application state in read operation.

FIG. 10 shows a voltage application state in read operation. Here, the well regions WEL1 to WELn are not divided. Negative voltage VnR (−2V) such as −2V is applied to all the well regions WEL. The memory cell MC1 is a selected memory cell. The memory cells MC2 to MC4 are unselected memory cells. The memory cells MC1 and MC2 are arranged in the same well region. The unselected memory cells MC3 and MC4 are arranged in a well region different therefrom. 0V is applied to the selected word line MWL1. The negative voltage VnR (−2V) is applied to the unselected word line NMWL2. The source lines SL1 and SL2 are at 0V. A read voltage such as 1V is applied via a sense amplifier to the bit line BL1 in the well region in which read operation is selected. The bit line BL2 in the well region in which read operation is unselected is at 0V.

The memory cell MC1 is brought to the on state when the threshold voltage is negative to flow an electric current from the bit line to the source line. The memory cell MC1 is brought to the off state when the threshold voltage is positive to flow no electric current. Depending on the presence or absence of an electric current, the sense amplifier judges 1/0 of stored information.

Since a reverse bias of 2V is applied between the well region and the source of the memory cell MC2, the memory cell MC2 is brought to the off state irrespective of whether the threshold voltage is positive or negative so that no electric current is flowed. Since the well region WEL and the gate (MWL) are both at −2V without any potential difference, disturb is not caused. From the same reason, the memory cell MC4 cannot cause disturb.

A 0V channel is formed in the memory cell MC3 when the threshold voltage is negative. No potential difference is produced between the gate and the well region. An electric field shifting the threshold voltage is not produced. When the threshold voltage of the memory cell MC3 is positive, a potential difference of 2V is produced between the gate and the well region. The threshold voltage is shifted to the positive side as a better direction.

The EEPROM 6 has a low power consumption mode (also called a standby mode). When the standby mode is instructed to the control circuit 40 by external control signal CNT, the control circuit 40 allows the booster 38 to output a boosting voltage of −1.5V for applying a boosting voltage of −1.5V to all the word lines and well regions. 0V or −1.5V is supplied to all the bit lines and source lines.

Figure 11:
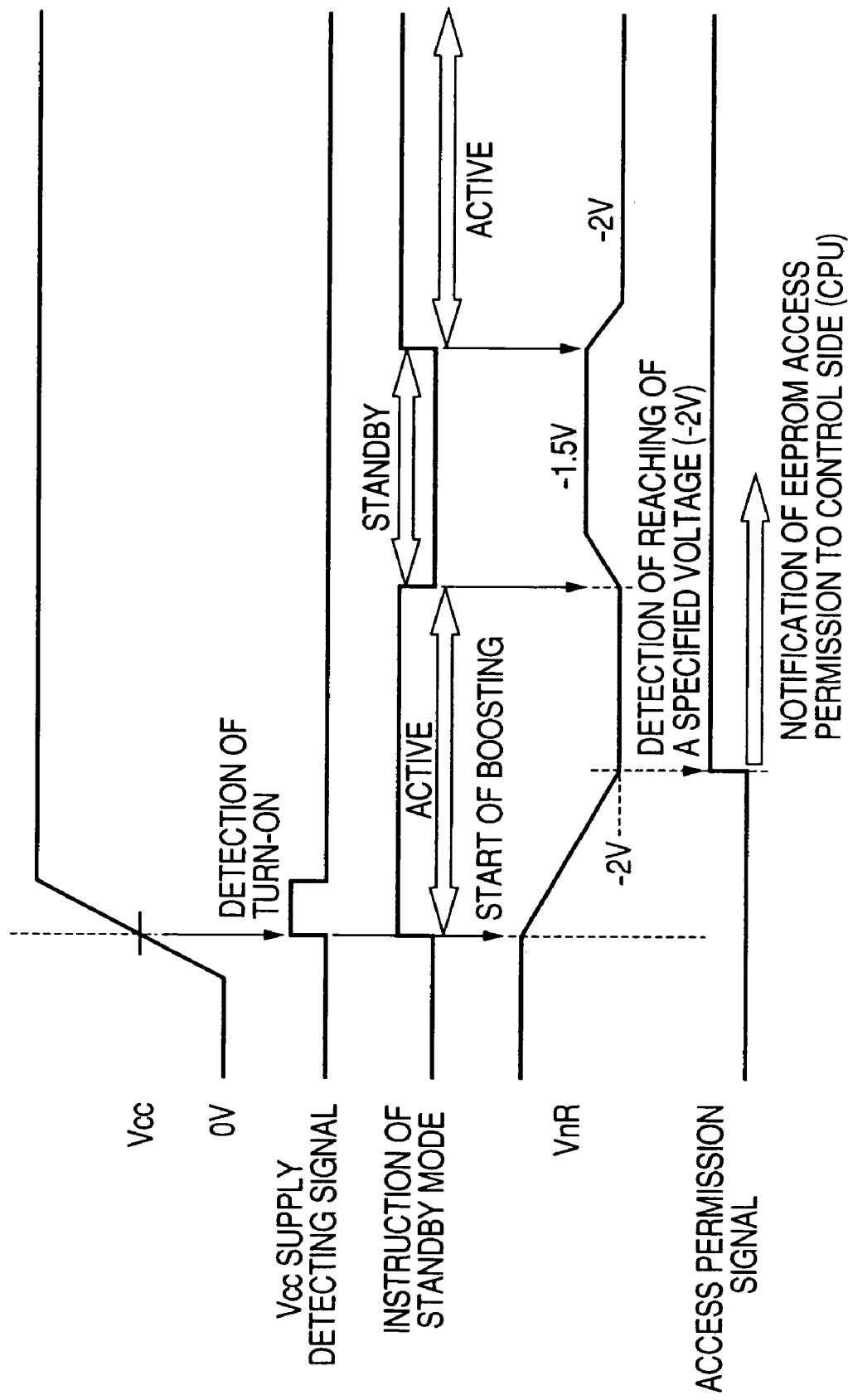
FIG. 11 is a timing chart showing operating source voltage waveforms before and after a standby mode.

FIG. 11 shows an example of source voltage waveforms. When supplying the external power source Vcc and detecting it, boosting operation is started. After the level of the negative voltage VnR of the read system is stable at −2V, an access permission signal is outputted to the outside. The access permission signal is included in the control signal CNT. The EEPROM 6 responds to a read request from the outside to perform read operation. When instructing the stand by mode from the outside, the booster 38 does not stop the boosting operation and forms only a boosting voltage of −1.5V to output it. When releasing the standby mode, the booster 38 can perform boosting operation at high speed to the specified −2V. Boosting operation time necessary from the release of the standby mode in the EEPROM 6 to the restart of read operation can be shortened to reduce a delay for the restart of read operation. The standby mode of the EEPROM 6 may be an operating mode instructed based on the instruction of the standby mode to the microcomputer.

<<Word Driver>>

Figure 12:
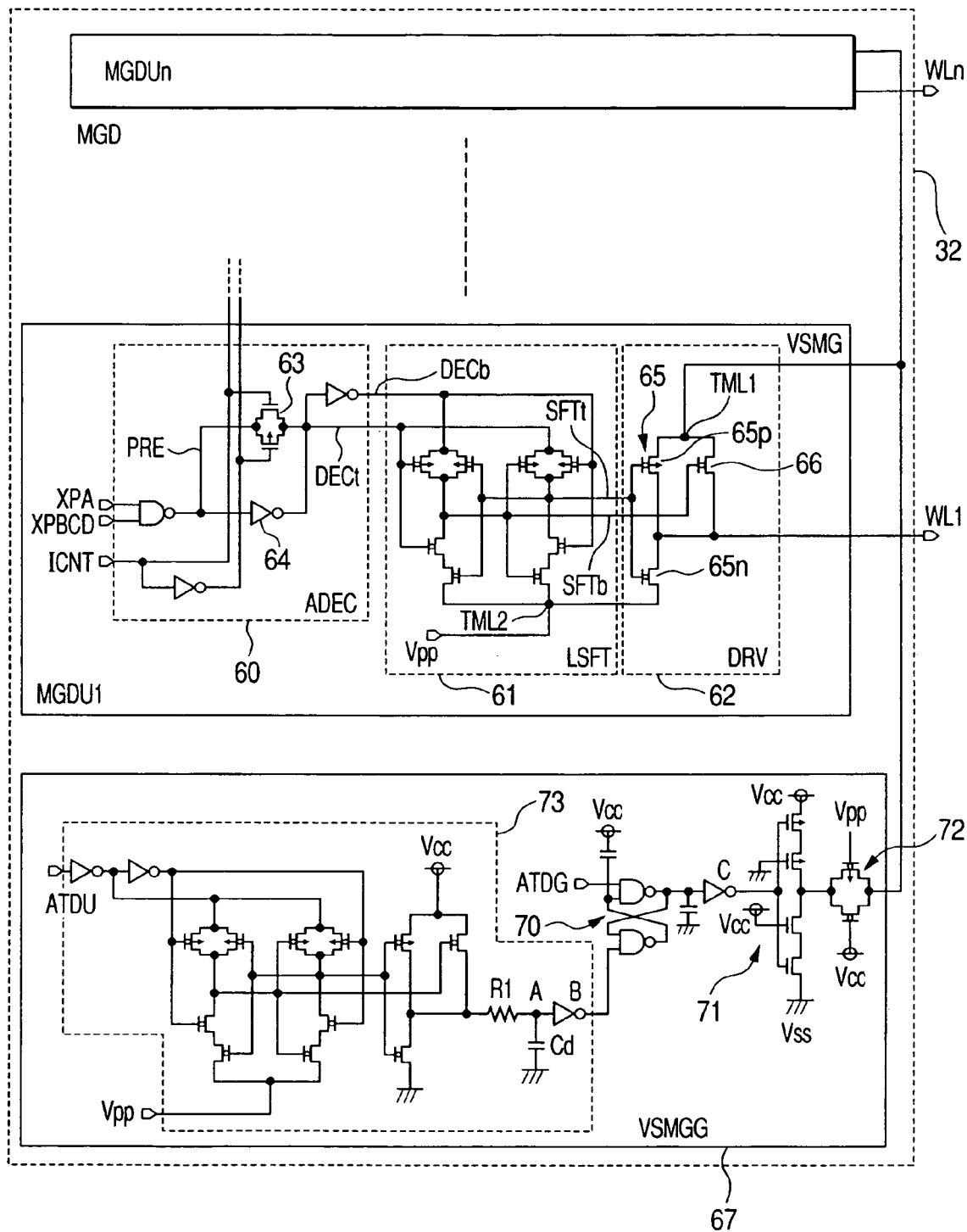
FIG. 12 is a circuit diagram showing an example of a word driver.

FIG. 12 shows an example of the word driver 32. The word driver circuit 32 has drive units MGDU1 to MGDn for each of the word lines WL1 to WLn. The detail is representatively shown in the drive unit MGDU1. The drive unit MGDU1 has an address decoder (ADEC) 60, a level shifter (LSFT) 61, and an output driver (DRV) 62. The address decoder 60 decodes pre-decode signals XPA and XPBCD of the address signals. The decoded results are outputted as complementary signals DECt and DECb. A transfer gate 63 and a clocked inverter 64 are circuit elements for switching between inversion and non-inversion of the complementary signals DECt and DECb by control signal ICNT for responding to the difference in operation in which a high voltage (−10.7V) is applied to a write-unselected word line at write and a high voltage (−8.5V) is applied to an erase-selected word line at erase. The operating power source of the address decoder 60 is Vcc (1.5V) to Vss (0V).

The level shifter 61 converts the complementary signals DECt and DECb having a signal amplitude of Vcc (1.5V) to Vss (0V) to the amplitude of vcc to Vpp. The Vpp is changed at write, erase, and read. As is apparent from the above description, it is −10.7V at write, −8.5V at erase, or −2V at read.

Figure 13:
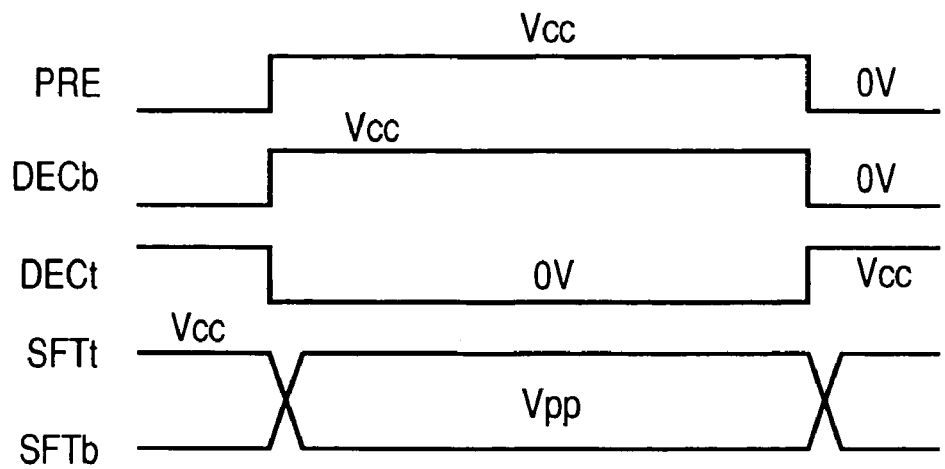
FIG. 13 is a timing chart showing the waveforms of main signal nodes in the drive unit of the word driver.

The driver 62 uses the Vpp and VSGM as operating power sources. A terminal to which the Vpp is supplied is the second terminal TML2. A terminal to which the voltage VSGM is supplied is the first terminal TML1. The driver 62 has a CMOS inverter 65 having a p-channel MOS transistor 65p and a channel MOS transistor 65n between the first terminal TML1 and the second terminal TML2, and an n-channel MOS transistor 66 connected in parallel with the p-channel MOS transistor 65p and switch controlled in phase. The voltage VSMG is formed by a voltage generator (VSMGG) 67. FIG. 13 shows the waveforms of main signal nodes in the drive unit MGDU1.

The voltage VSGM is 1.5 to 0V. In erase operation and write operation, the voltage VSGM is Vcc=1.5V. The operating power source of the driver 62 is the Vpp to Vcc equal to the operating power source of the level shifter 61. In read operation, the voltage VSGM is Vss=0V. The operating power source of the driver is lower on the high level power source side than the level shifter 61. In read operation, the Vgs when the p-channel MOS transistor 65p is turned on is smaller than the Vgs when the n-channel MOS transistor 65n is turned on. The n-channel MOS transistor 66 connected in parallel with the p-channel MOS transistor 65p of the CMOS inverter 65 and switch controlled in phase is added. When inversion driving the unselected word line at a negative voltage such as −2V to the select level such as 0V by the driver 62, the n-channel MOS transistor 66 can complement the driving ability of the p-channel MOS transistor 65p of the CMOS inverter 65. During the driving period, the voltage generator 67 boosts the drain voltage VSMG of the n-channel MOS transistor 65n from the circuit ground voltage Vss to a positive voltage to increase the word line charging ability of the n-channel MOS transistor 66. The positive voltage is desirably a voltage above the threshold voltage of the n-channel MOS transistor 66.

The voltage generator (VSMGG) 67 has a latch circuit 70 inputting signal ATDG and signal B and outputs the voltage VSGM of 0V or 1.5V via an inverter 71 receiving the latch output of the latch circuit 70 and a transfer gate 72. When the signal ATDG is at high level, signal C is at high level. When the signal ATDG is at low level, the signal C is at low level. When the signal B is changed from the high level to the low level, the signal C is inverted to the high level in synchronization there with. The circuit generating the signal B is a circuit using the change of signal ATDU as a trigger to change the signal B from the high level to the low level in a predetermined delay time. The predetermined delay time is decided by resistance R1 and the time constant of capacitance Cd. Here, the signal ATDU is clock changed in each read operation cycle to slightly increase the voltage VSMG from the circuit ground voltage Vss by a predetermined time specified by the delay time for enhancing the word line charging ability of the n-channel MOS transistor 66.

Figure 14:
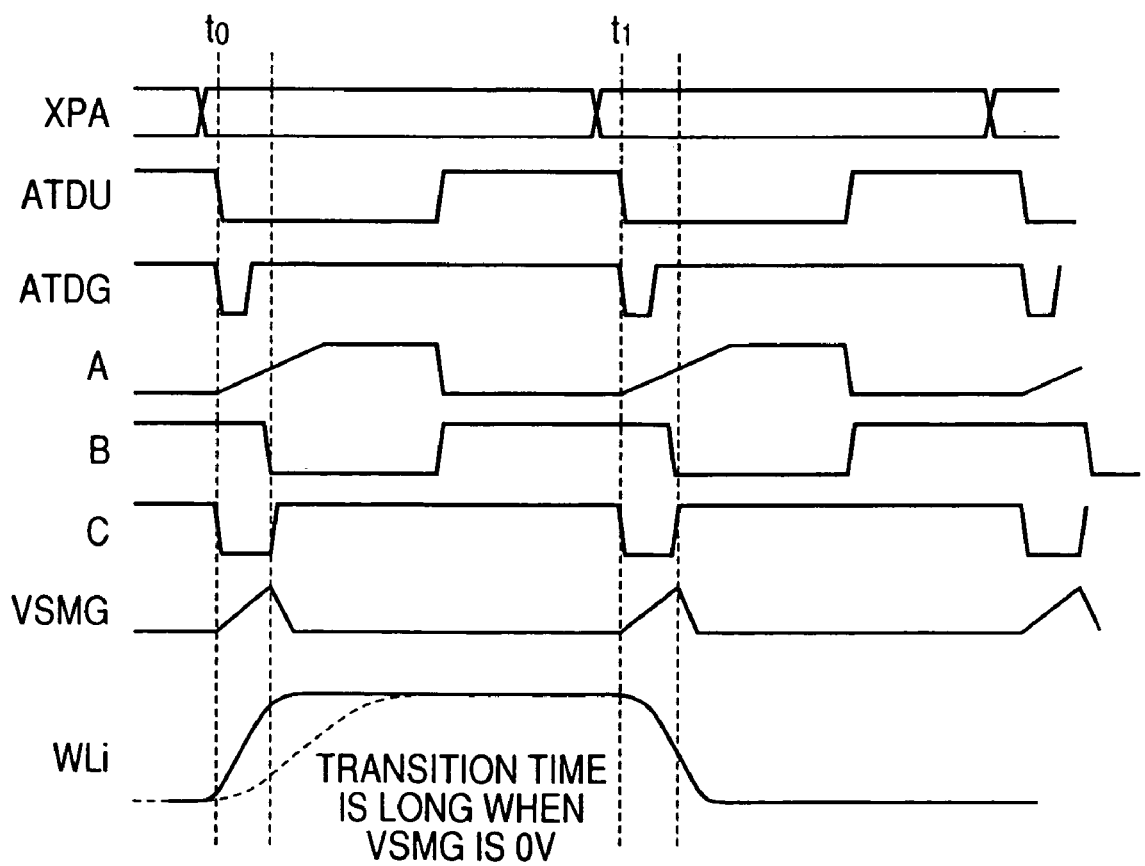
FIG. 14 is a timing chart showing main signal waveforms in a voltage generator of the word driver.

FIG. 14 shows main signal waveforms in the voltage generator (VSMGG) 67. The signal C is at low level from time t0 and t1 by a fixed delay time to slightly level increase the VSMG during that. When the word line WLi is inverted from the unselect level of −2.0V to the select level of 0V, the VSMG remains at 0V. As indicated by the dashed line, the transition time to 0V is longer.

Changing of the signal ATDU may be stopped in write and erase operations to decide the value of the signal ATDG in accordance with write select/unselect and erase select/unselect.

<<Reduction of Peak Current with Operation Switching>>

Figure 15:
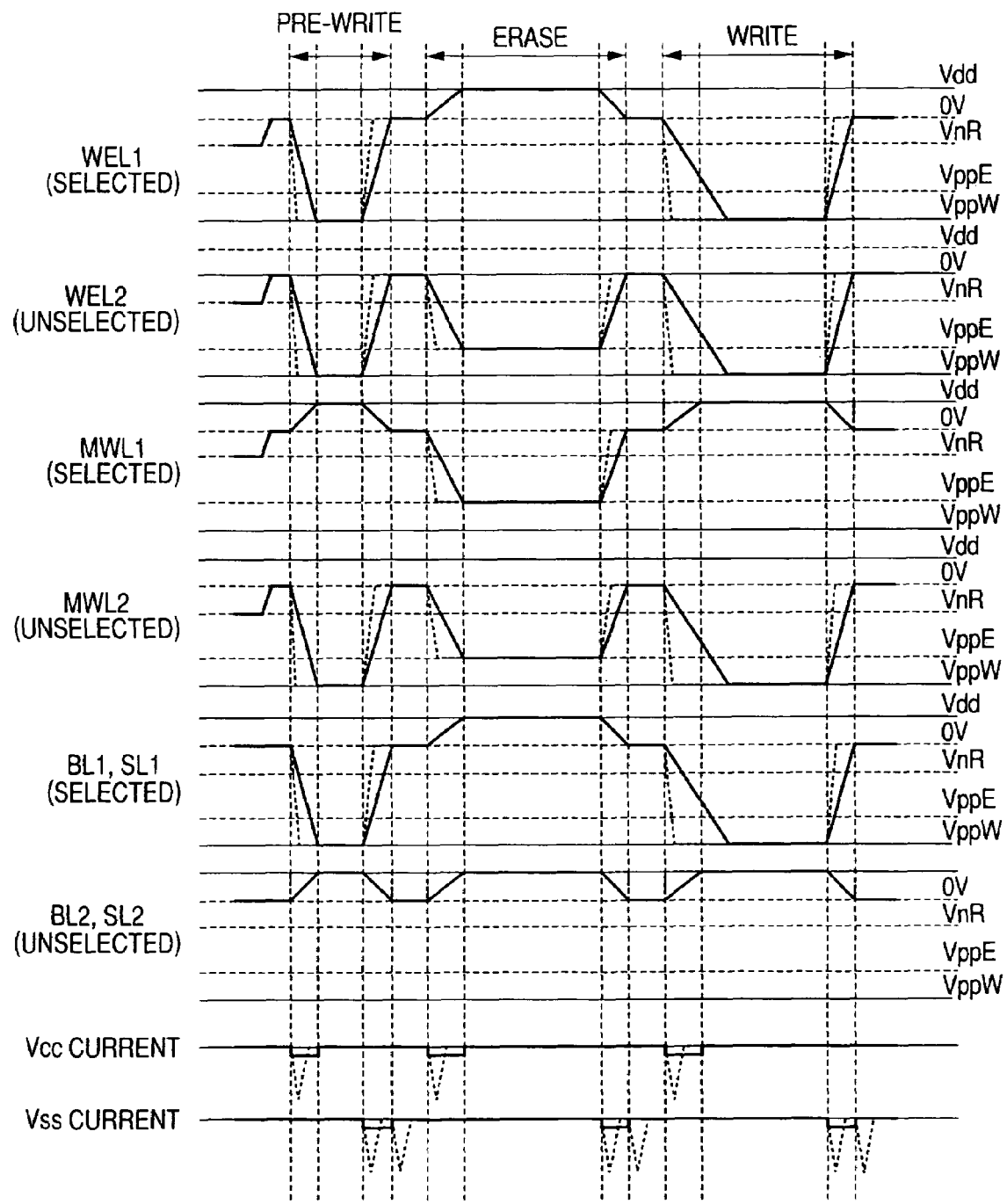
FIG. 15 is a timing chart showing changes of operating power sources with operation switching.
Figure 16:
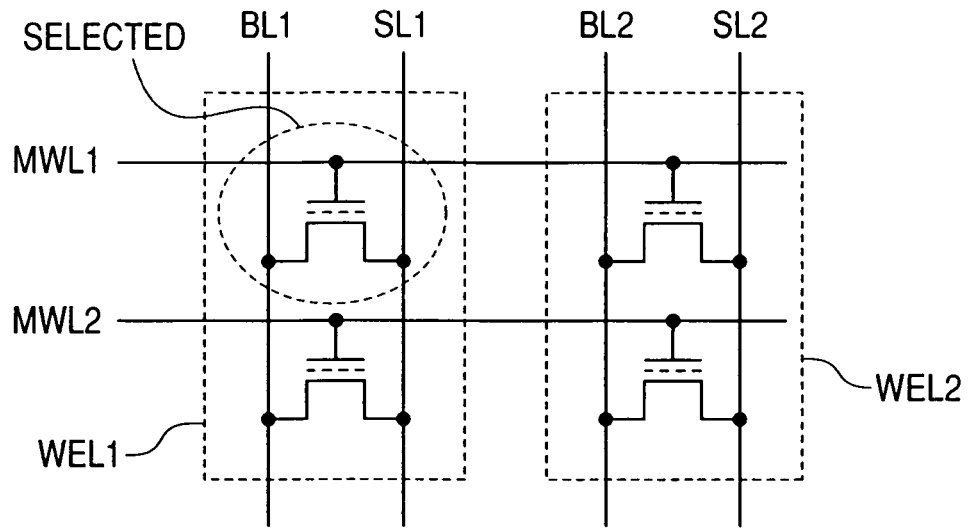
FIG. 16 is an explanatory view schematically showing a memory array structure noted in the operation switching forms of FIG. 15.

FIG. 15 shows changes of operating power sources with operation switching. In the switching forms shown in the drawing, two well regions WEL1 and WEL2 of FIG. 16 are noted. Vcc is a source voltage. 0V is a circuit ground voltage. VnR is an unselected word line voltage in read operation. VppE is an erasing high voltage such as −8.5V. VppP is a writing high voltage such as −10.7V. The cases of performing pre-write, erase, and write operations are shown. The dashed lines indicate as comparative examples the case that the power source switching speed with operating mode switching is high. The state of producing a current peak abruptly changed in the power source Vcc and the ground voltage Vss by sudden voltage application and release is shown. Desirable forms are as indicated by the solid lines. No abrupt current peak is caused.

Figure 17:
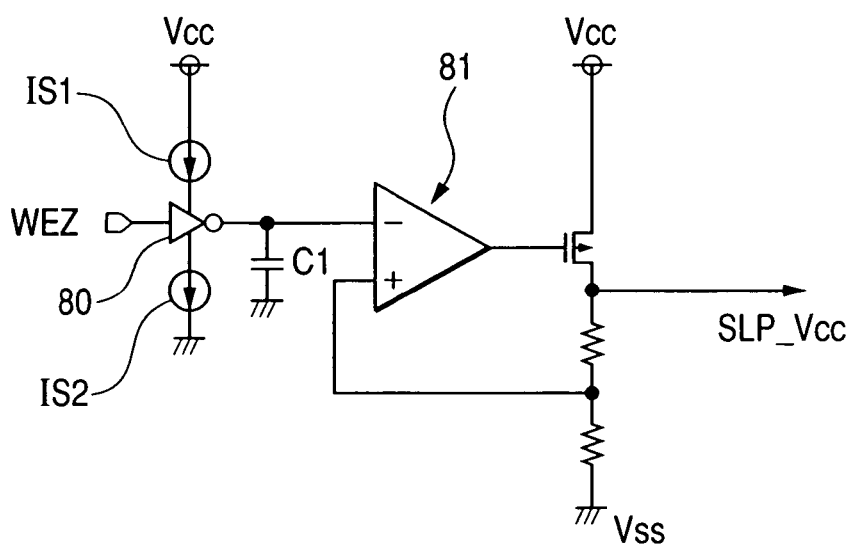
FIG. 17 is a circuit diagram showing a speed control circuit controlling rising and falling speeds of source voltage Vcc.
Figure 18:
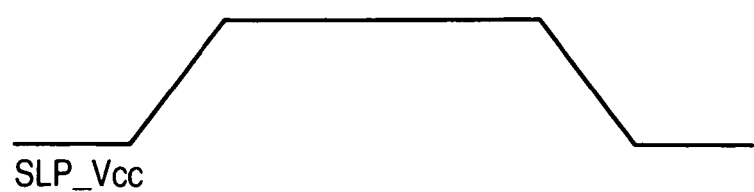
FIG. 18 is a waveform diagram showing rising and falling waveforms of the source voltage Vcc.

FIG. 17 shows a speed control circuit of rising and falling of power supply arranged in the supply system of the source voltage Vcc. An inverter 80 is connected via current sources IS1 and IS2 to the source voltage Vcc and the ground voltage Vss. A control signal WEZ switches whether the source voltage Vcc is supplied or the ground voltage Vss is supplied. Capacitance C1 is provided as a time constant device between the inverter 80 and an output buffer 81. As shown in FIG. 18, when switching output SLP_Vcc from the ground voltage Vss to the Vcc, the changing speed of the output SLP_Vcc is lowered by time required for charging the capacitance C1 via the current source IS1. When switching the output SLP_Vcc from the Vcc to the ground voltage Vss, the changing speed of the output SLP_Vcc is lowered by time required for discharging electric charges of the capacitance C1 via the current source IS2.

Figure 19:
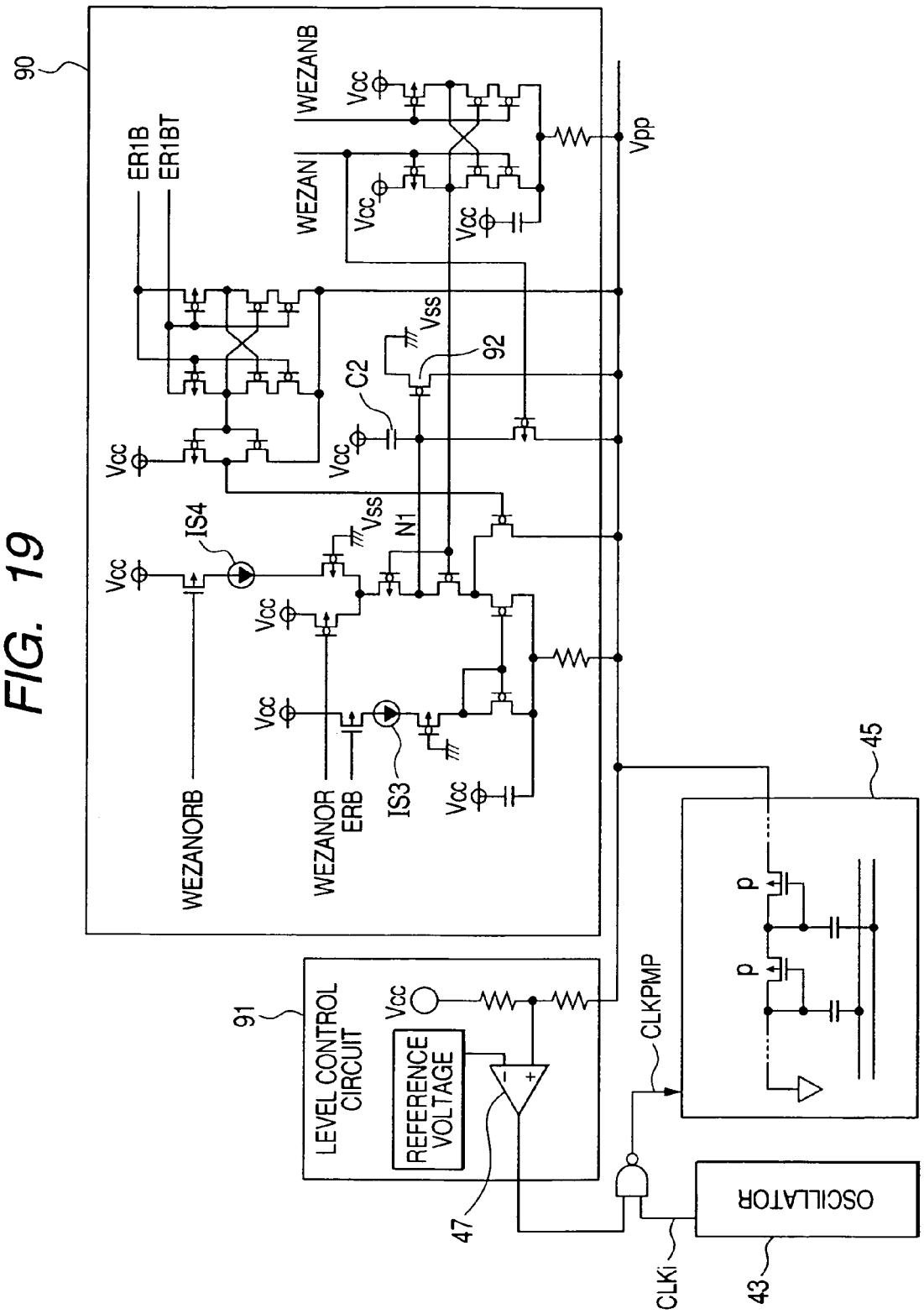
FIG. 19 is a circuit diagram showing a speed control circuit controlling the transition speeds in the start of boosting and the stop of boosting of a booster 38.

FIG. 19 shows a speed control circuit 90 controlling the transition speeds in the start of boosting and the stop of boosting of the booster 38. The speed control circuit 90 shown in the drawing is included in the booster 38. As described above, the level of the boosting voltage Vpp is decided by the set value of the reference voltage in a level control circuit 91. When stopping the boosting operation of the charge pump 45, the output node of the voltage Vpp is at 0V.

Figure 20:
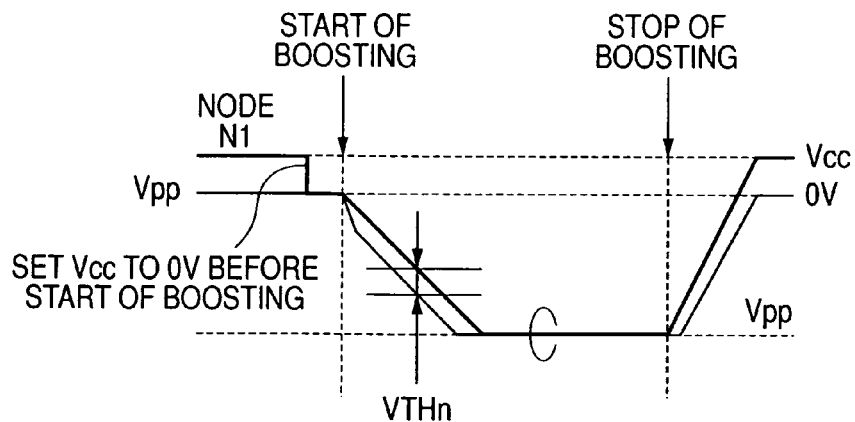
FIG. 20 is a waveform diagram showing charging/discharging operation waveforms when employing the speed control circuit.

When the speed control circuit 90 starts boosting operation boosting the output node of the Vpp from 0V to a specified negative high voltage, capacitance C2 as a time constant device is discharged by an electric current flowing to current source IS3. An n-channel MOS transistor 92 is switch controlled at the level of the storage electrode of the capacitance C2 to prevent the voltage of the node Vpp from being abruptly lowered. As shown in FIG. 20, the level of node N1 is level lowered in accordance with a predetermined discharge time constant to the level lowering of the Vpp in accordance with the operation of the charge pump 45. A potential difference is produced between the potential of the node Vpp as a source potential of the MOS transistor and the storage electrode of the capacitance C2 as a gate potential. The potential difference is larger as the boosting speed is higher. When the potential difference exceeds threshold voltage VTHn of the MOS transistor 92, the MOS transistor 92 is turned on to supply the ground voltage Vss to the node Vpp for substantially lowering the boosting operation speed, thereby preventing the abrupt level change to a negative voltage.

Figure 21:
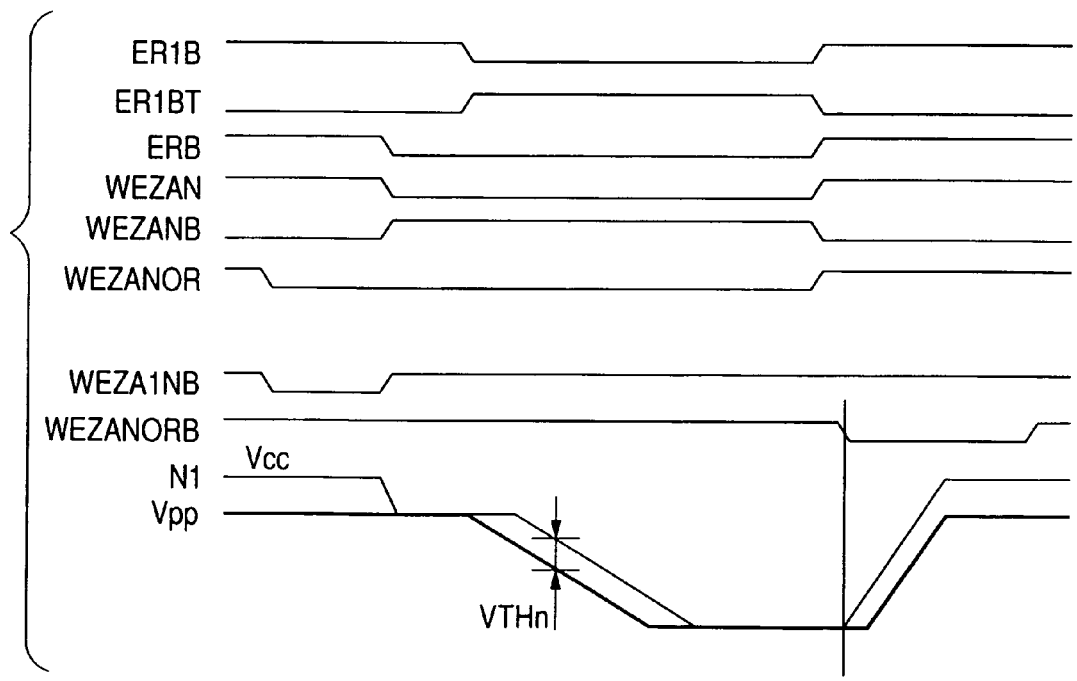
FIG. 21 is a timing chart showing the detailed operation timings of the speed control circuit of FIG. 19.

When stopping boosting operation to discharge the output node of the Vpp from a negative high voltage to 0V, the capacitance C2 is charged by an electric current flowing to current source IS4 to switch control the n-channel MOS transistor 92 at the level of the storage electrode of the capacitance C2 to prevent the voltage of the node Vpp from being abruptly changed. As shown in FIG. 20, when stopping the operation of the charge pump 45, the level of the node N1 is level increased in accordance with a predetermined discharge time constant to the level increase of the node Vpp. The MOS transistor is turned on to gently charge the node Vpp to the ground potential. In FIG. 19, the speed control circuit 90 is a time constant circuit. FIG. 21 shows the detailed operating timings of the speed control circuit 90 of FIG. 19.

The speed control circuit shown in FIGS. 17 and 19 can prevent the operating speed switching application of a high voltage or a source voltage in write operation and erase operation form being too high. It is possible to prevent abrupt flowing of a relatively large electric current and causing power source noise.

<<Increasing Read Speed>>

Figure 22:
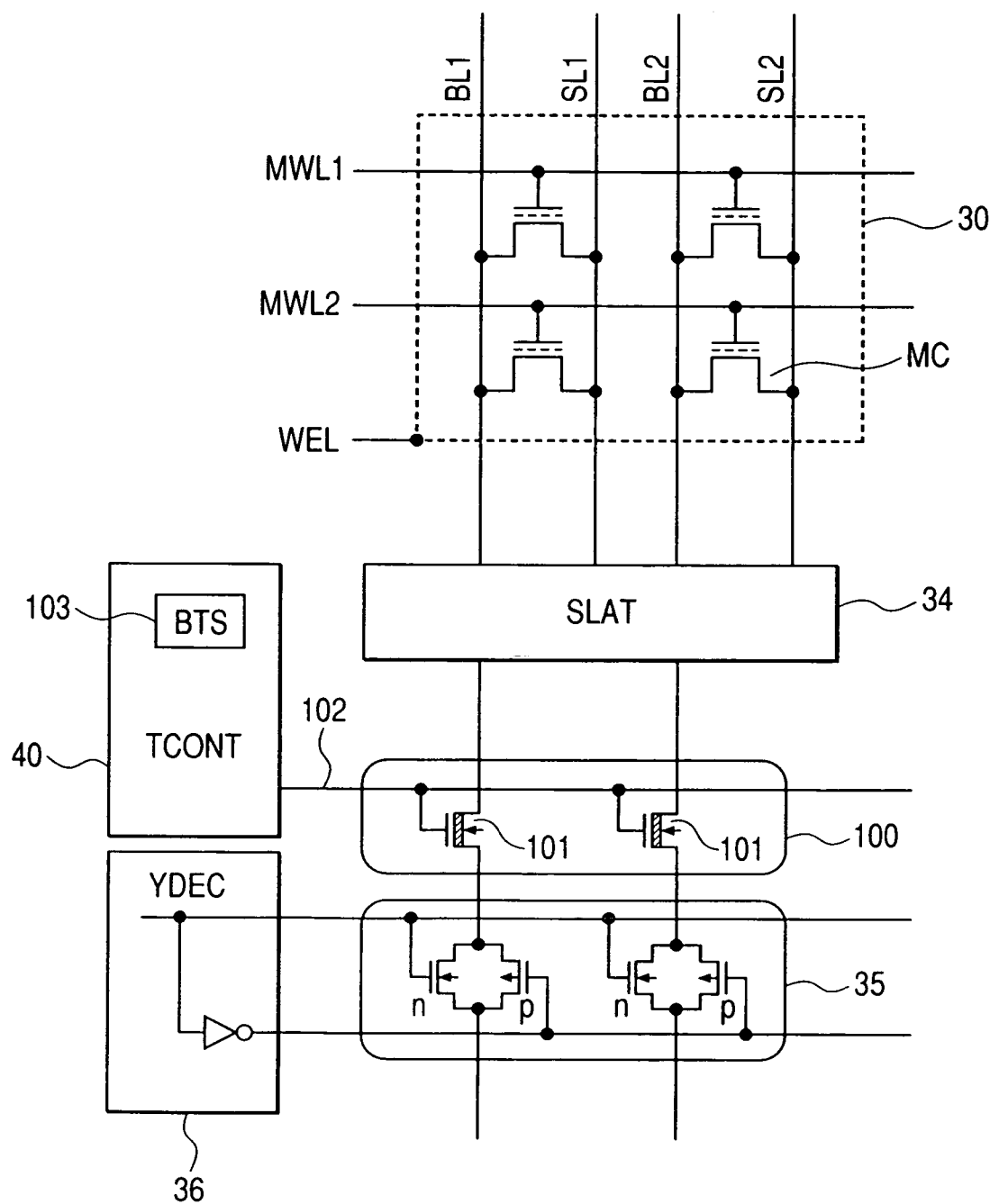
FIG. 22 is a block diagram showing the structure of the EEPROM noting an isolating circuit for preventing application of a high voltage to read paths.

FIG. 22 shows the structure of the EEPROM 6 noting an isolating circuit for preventing application of a high voltage to read paths. An isolating circuit 100 is provided between the latch circuit 34 and the column switch circuit 35 and prevents write and erase high voltages applied to the bit lines BL21 and BL2 from being applied to the column switch circuit 35 and a low voltage circuit such as a sense amplifier, not shown. The isolating circuit 100 is constituted of high voltage switch MOS transistors 101 having a thick gate oxide film. The high voltage switch MOS transistors 101 are switch controlled by a control signal 102. The control circuit 40 has a booster 103 forming the signal voltage of the control signal 102 on-operating the switch MOS transistors 101 in read operation by the boosting operation of the external source voltage vcc.

Figure 23:
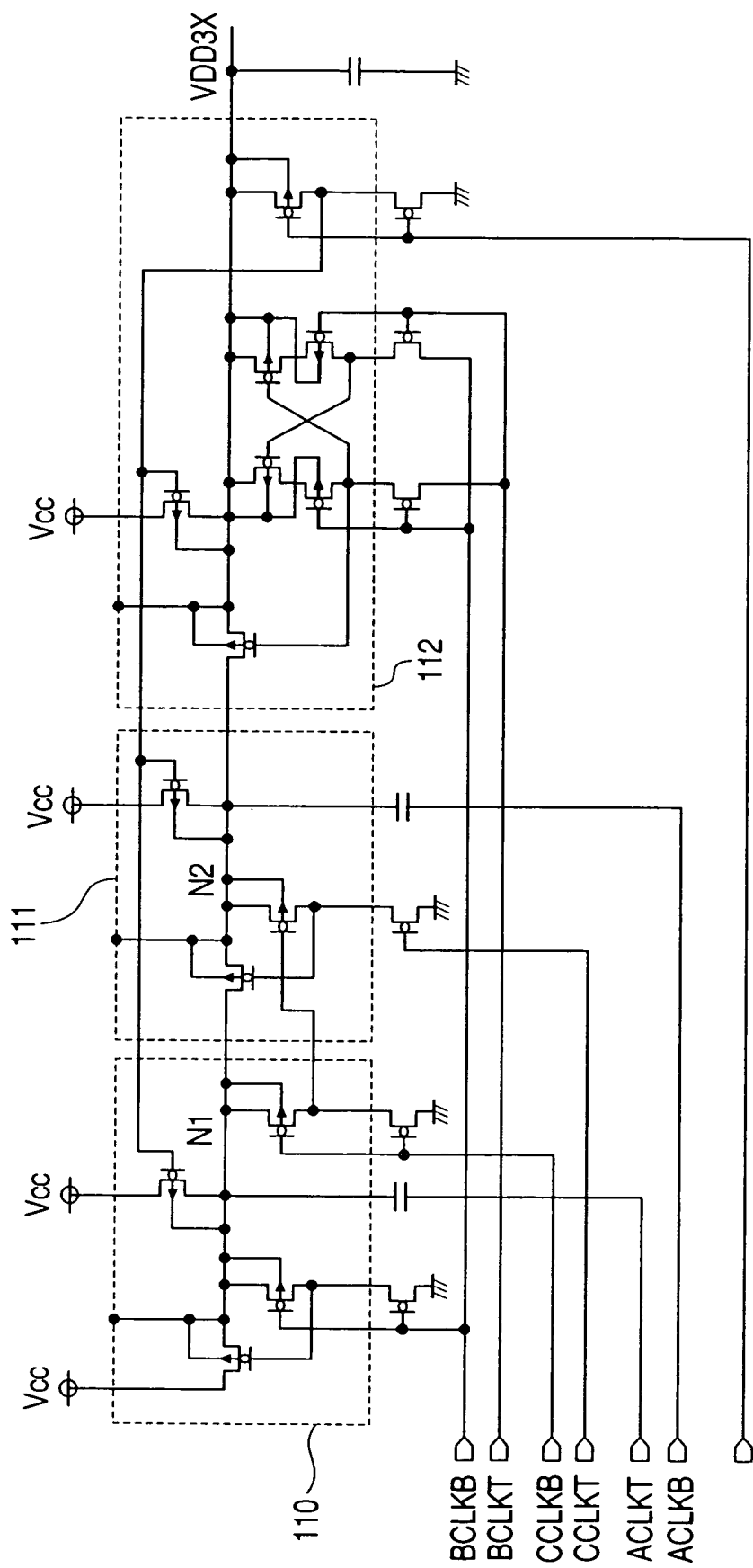
FIG. 23 is a block diagram of a booster forming a signal voltage used for switch control of the isolating circuit.
Figure 24:
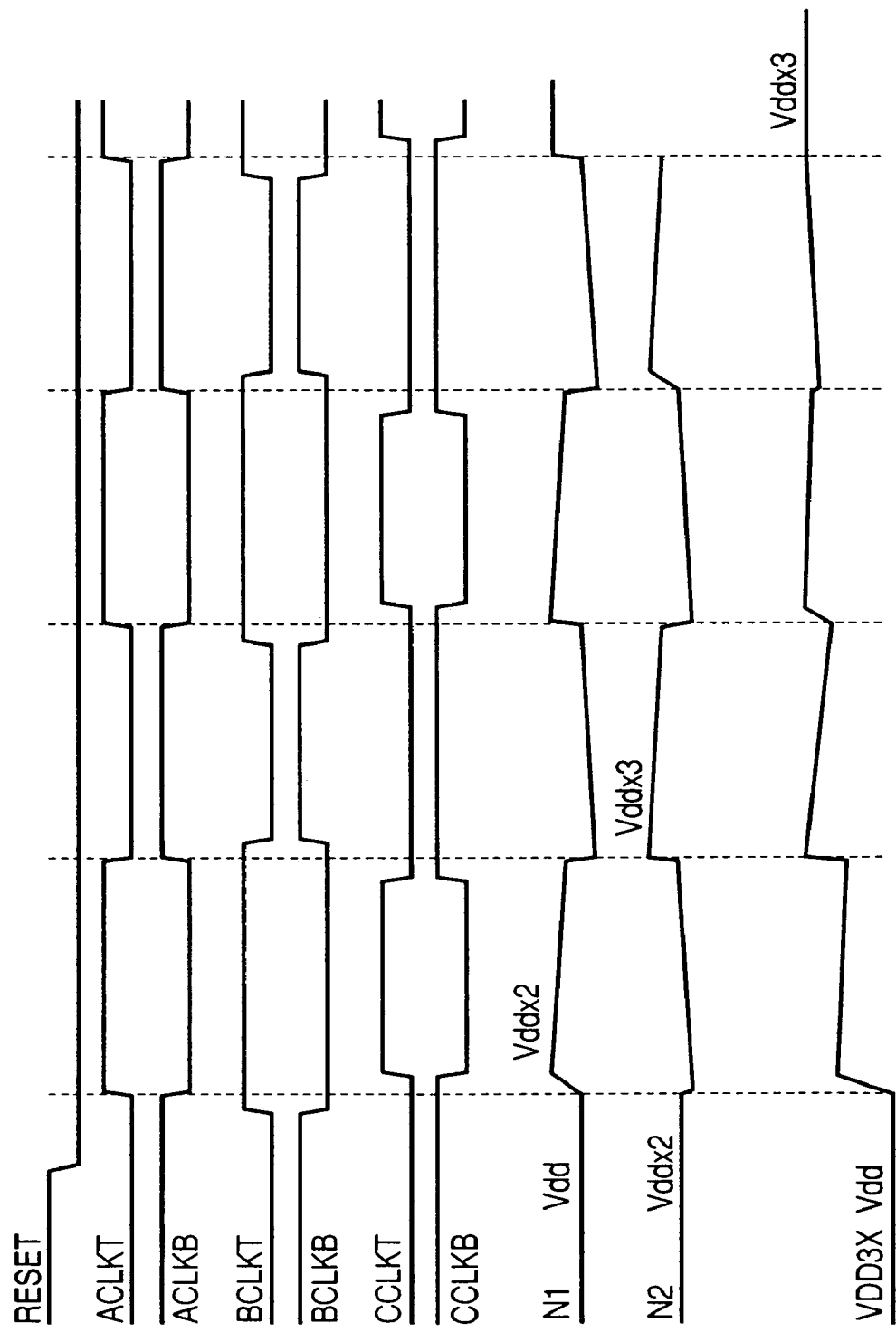
FIG. 24 is a timing chart of the boosting operation of the booster of FIG. 23.

FIG. 23 shows an example of the booster 103. Circuits 110, 111, and 112 are formed in different well regions. FIG. 24 shows a timing chart of the boosting operation of the booster of FIG. 23. The booster outputs boosting voltage VDD3X three times larger than the source voltage Vcc.

A high voltage is applied to the bit lines BL1 and BL2 at write and erase. The bit lines BL1 and BL2 can be selectively isolated from the read system such as a sense amplifier via the isolating circuit 100. The high voltage switch MOS transistors 101 having a thick gate oxide film are employed for such isolating circuit 100. In read operation, a signal voltage on-operating the high voltage switch MOS transistors 101 is formed by boosting operation of the external source voltage Vcc. The on-state resistance can be small. It is possible to prevent increase of an undesired resistance component in a read path and lowering of the read speed of stored information.

The inventions which have been made by the present inventors are specifically described above based on the embodiments. The present invention is not limited thereto and various modifications can be made in the scope without departing from its purpose.

The memory array is not limited to NOR type. It can be applied to EEPROM such as a NAND type memory array. The definitions of write and erase are relative. Write and erase can be reversely defined in such a manner that an operation increasing a threshold voltage is erase operation and an operation decreasing a threshold voltage is write operation. The charge storage insulator film is not limited to a silicon nitride film and may be a film in which carbon particles or silicon is dispersed in a dielectric.

What is claimed is:

1. A data processing device having nonvolatile memory which can electrically rewrite stored information, wherein said nonvolatile memory has in well regions plural nonvolatile memory cell transistors having drain electrodes and source electrodes respectively coupled to bit lines and source lines and gate electrodes coupled to word lines and storing information based on a difference between threshold voltages to a word line select level in read operation, wherein said nonvolatile memory has a low power consumption mode, and wherein in said low power consumption mode, a second voltage lower than a circuit ground voltage and higher than a first negative voltage necessary for read operation is supplied to said well regions and word lines.

2. The data processing device according to claim 1, wherein an equal third voltage is supplied to the bit lines and the source lines of said nonvolatile memory cell transistors in said low power consumption mode.

3. The data processing device according to claim 2, wherein said second voltage is equal to said third voltage.

4. The data processing device according to claim 3, further comprising a negative booster capable of forming said first voltage and second voltage.

* * * * *